United States Patent
Coe-Sullivan et al.

(10) Patent No.: US 8,835,941 B2
(45) Date of Patent: Sep. 16, 2014

(54) DISPLAYS INCLUDING SEMICONDUCTOR NANOCRYSTALS AND METHODS OF MAKING SAME

(75) Inventors: Seth Coe-Sullivan, Belmont, MA (US); Gregory V. Moeller, Ashland, MA (US); Vladimir Bulovic, Lexington, MA (US); Ioannis Kymissis, New York, NY (US)

(73) Assignee: QD Vision, Inc., Lexington, MA (US)

( * ) Notice: Subject to any disclaimer, the term of this patent is extended or adjusted under 35 U.S.C. 154(b) by 1053 days.

(21) Appl. No.: 11/704,382

(22) Filed: Feb. 8, 2007

(65) Prior Publication Data

US 2010/0134520 A1    Jun. 3, 2010

Related U.S. Application Data

(60) Provisional application No. 60/771,643, filed on Feb. 9, 2006.

(51) Int. Cl.
| | | |
|---|---|---|
| H01L 33/00 | (2010.01) | |
| B82Y 30/00 | (2011.01) | |
| B82Y 20/00 | (2011.01) | |
| H01L 51/50 | (2006.01) | |

(52) U.S. Cl.
CPC .............. *H01L 51/5012* (2013.01); *B82Y 30/00* (2013.01); *B82Y 20/00* (2013.01)
USPC ............................................. 257/84; 345/690

(58) Field of Classification Search
CPC ......... H01L 33/18; H01L 33/44; H01L 33/50; H01L 33/60; H01L 27/3244
USPC ............ 345/77, 690; 257/98, 99, 103, 59, 72, 257/79
See application file for complete search history.

(56) References Cited

U.S. PATENT DOCUMENTS

| | | |
|---|---|---|
| 4,409,724 A | 10/1983 | Tasch et al. |
| 5,200,668 A | 4/1993 | Ohashi et al. |
| 5,244,828 A | 9/1993 | Okada et al. |
| 5,281,543 A | 1/1994 | Fukuzawa et al. |
| 5,293,050 A | 3/1994 | Chapple-Sokol et al. |
| 5,354,707 A | 10/1994 | Chapple-Sokol et al. |
| 5,512,131 A | 4/1996 | Kumar et al. |
| 5,537,000 A | 7/1996 | Alivisatos et al. |

(Continued)

FOREIGN PATENT DOCUMENTS

| | | |
|---|---|---|
| EP | 0774787 | 2/2004 |
| JP | 07086615 | 3/1995 |
| WO | WO2007092606 A2 | 8/2007 |
| WO | WO2007092606 A3 | 8/2007 |

OTHER PUBLICATIONS

Adachi, et al., "High-Efficiency Red Electrophosphorescence Devices", Appl. Phys. Lett. 78, 1622, 2001.

(Continued)

*Primary Examiner* — Whitney T Moore

(57) ABSTRACT

A display comprises a substrate and a light-emitting device disposed on the substrate, wherein the substrate comprises a semiconducting material and a circuit for controlling the light-emitted from the light-emitting device. A light-emitting device includes a light-emitting material comprising semiconductor nanocrystals and an electrode in electrical connection with the light-emitting material on a side thereof remote from the substrate.

23 Claims, 2 Drawing Sheets

(56) References Cited

U.S. PATENT DOCUMENTS

| | | | |
|---|---|---|---|
| 5,578,379 A | 11/1996 | Stutzmann et al. | |
| 5,607,876 A | 3/1997 | Biegelsen et al. | |
| 5,783,292 A | 7/1998 | Tokito et al. | |
| 5,866,039 A | 2/1999 | Morton | |
| 5,882,779 A | 3/1999 | Lawandy | |
| 6,027,958 A * | 2/2000 | Vu et al. | 438/110 |
| 6,157,047 A | 12/2000 | Fujita et al. | |
| 6,180,239 B1 | 1/2001 | Whitesides et al. | |
| 6,194,237 B1 | 2/2001 | Kim et al. | |
| 6,207,229 B1 | 3/2001 | Bawendi et al. | |
| 6,236,060 B1 | 5/2001 | Chan et al. | |
| 6,322,901 B1 | 11/2001 | Bawendi et al. | |
| 6,512,172 B1 | 1/2003 | Salafsky et al. | |
| 6,518,168 B1 | 2/2003 | Clem et al. | |
| 6,544,808 B2 | 4/2003 | Hoon | |
| 6,544,870 B2 | 4/2003 | Park et al. | |
| 6,576,291 B2 | 6/2003 | Bawendi et al. | |
| 6,579,422 B1 * | 6/2003 | Kakinuma | 204/192.13 |
| 6,586,785 B2 | 7/2003 | Flagan et al. | |
| 6,677,610 B2 | 1/2004 | Choi et al. | |
| 6,697,403 B2 | 2/2004 | Lee et al. | |
| 6,706,551 B2 | 3/2004 | Andriessen | |
| 6,710,366 B1 * | 3/2004 | Lee et al. | 257/14 |
| 6,753,273 B2 | 6/2004 | Holonyak et al. | |
| 6,760,034 B2 | 7/2004 | Prache | |
| 6,762,069 B2 | 7/2004 | Huang et al. | |
| 6,791,105 B2 | 9/2004 | Shim et al. | |
| 6,797,412 B1 | 9/2004 | Jain et al. | |
| 6,859,474 B1 | 2/2005 | Johnson et al. | |
| 6,861,155 B2 | 3/2005 | Bawendi et al. | |
| 6,861,674 B2 | 3/2005 | Perlo et al. | |
| 6,940,087 B2 | 9/2005 | Komoda et al. | |
| 6,949,879 B1 | 9/2005 | Wright et al. | |
| 6,992,317 B2 | 1/2006 | Jain et al. | |
| 7,132,787 B2 | 11/2006 | Ozkan et al. | |
| 7,160,613 B2 | 1/2007 | Bawendi et al. | |
| 7,172,791 B2 | 2/2007 | Treadway et al. | |
| 7,199,393 B2 | 4/2007 | Park et al. | |
| 7,208,768 B2 | 4/2007 | Ono et al. | |
| 7,253,452 B2 | 8/2007 | Steckel et al. | |
| 7,332,211 B1 | 2/2008 | Bulovic et al. | |
| 7,390,568 B2 | 6/2008 | Kim et al. | |
| 7,700,200 B2 | 4/2010 | Bulovic et al. | |
| 7,880,377 B2 | 2/2011 | Orita et al. | |
| 8,134,175 B2 | 3/2012 | Bawendi et al. | |
| 2003/0034486 A1 | 2/2003 | Korgel | |
| 2003/0042850 A1 | 3/2003 | Bertram et al. | |
| 2004/0023010 A1 | 2/2004 | Bulovic et al. | |
| 2004/0151461 A1 * | 8/2004 | Hill | 385/129 |
| 2004/0265622 A1 | 12/2004 | Sadasivan et al. | |
| 2005/0088380 A1 | 4/2005 | Bulovic et al. | |
| 2005/0116621 A1 * | 6/2005 | Bellmann et al. | 313/503 |
| 2005/0230673 A1 | 10/2005 | Mueller et al. | |
| 2005/0236556 A1 | 10/2005 | Sargent et al. | |
| 2005/0258418 A1 | 11/2005 | Steckel et al. | |
| 2005/0279989 A1 | 12/2005 | Li et al. | |
| 2006/0034065 A1 | 2/2006 | Thurk | |
| 2006/0043361 A1 | 3/2006 | Lee et al. | |
| 2006/0063029 A1 | 3/2006 | Jang et al. | |
| 2006/0157720 A1 | 7/2006 | Bawendi et al. | |
| 2006/0196375 A1 | 9/2006 | Coe-Sullivan et al. | |
| 2006/0204675 A1 | 9/2006 | Gao et al. | |
| 2006/0243962 A1 | 11/2006 | Tang et al. | |
| 2006/0243993 A1 | 11/2006 | Yu et al. | |
| 2006/0244016 A1 | 11/2006 | Mouli | |
| 2007/0001581 A1 | 1/2007 | Stasiak et al. | |
| 2007/0103068 A1 | 5/2007 | Bawendi et al. | |
| 2007/0257608 A1 | 11/2007 | Tyan et al. | |
| 2008/0001167 A1 | 1/2008 | Coe-Sullivan et al. | |
| 2008/0074050 A1 | 3/2008 | Chen et al. | |
| 2008/0150425 A1 | 6/2008 | Cho et al. | |
| 2008/0169753 A1 | 7/2008 | Skipor et al. | |
| 2008/0180020 A1 | 7/2008 | Cok | |
| 2008/0203895 A1 | 8/2008 | Miller et al. | |
| 2008/0203899 A1 | 8/2008 | Miller et al. | |
| 2008/0217602 A1 | 9/2008 | Kahen | |
| 2008/0278063 A1 | 11/2008 | Cok | |
| 2009/0001385 A1 | 1/2009 | Skipor et al. | |
| 2009/0001403 A1 | 1/2009 | Skipor et al. | |
| 2009/0017268 A1 | 1/2009 | Skipor et al. | |
| 2009/0181478 A1 | 7/2009 | Cox et al. | |
| 2009/0208753 A1 | 8/2009 | Coe-Sullivan et al. | |
| 2009/0215208 A1 | 8/2009 | Coe-Sullivan et al. | |
| 2009/0215209 A1 | 8/2009 | Anc et al. | |
| 2009/0278141 A1 | 11/2009 | Coe-Sullivan et al. | |
| 2009/0280586 A1 | 11/2009 | Coe-Sullivan et al. | |
| 2009/0283742 A1 | 11/2009 | Coe-Sullivan et al. | |
| 2009/0283743 A1 | 11/2009 | Coe-Sullivan et al. | |
| 2009/0283778 A1 | 11/2009 | Coe-Sullivan et al. | |
| 2009/0286338 A1 | 11/2009 | Coe-Sullivan et al. | |
| 2010/0001256 A1 | 1/2010 | Coe-Sullivan et al. | |
| 2010/0044635 A1 | 2/2010 | Breen et al. | |
| 2010/0044636 A1 | 2/2010 | Ramprasad et al. | |
| 2010/0051870 A1 | 3/2010 | Ramprasad | |
| 2010/0051901 A1 | 3/2010 | Kazlas et al. | |
| 2010/0068468 A1 | 3/2010 | Coe-Sullivan et al. | |
| 2010/0132770 A1 | 6/2010 | Beatty et al. | |
| 2011/0025224 A1 | 2/2011 | Wood et al. | |
| 2011/0080090 A1 | 4/2011 | Wood et al. | |
| 2011/0095261 A1 | 4/2011 | Kazlas et al. | |
| 2011/0127932 A1 | 6/2011 | Halpert et al. | |

OTHER PUBLICATIONS

Bulovic, et al., "Molecular Organic Light-Emitting Devices", Semiconductor and Semimetals, 64, 255, 2000.

D'Andrade, et al., "Bright White Electrophosphorescent Triple-Emissive Layer Organic Light Emitting Device", MRS Fall Meeting, BB6.2 2001.

Dabbousi, et al., "(CdSe) ZnS Core-Shell Quantum Dots: Synthesis and Characterizaqtion of a Size Series of Highly Luminescent Nanocrystallites", J. Phys. Chem. 101, 9463, 1997.

Dirr, et al., "Organic Light Emitting Diodes with Reduced Spectral and Spacial Halfwidths", Jpn. J. Appl. Phys. 37, 1457, 1998.

Howard, W.E., et al., "Microdisplays Based Upon Organic Light-Emitting Diodes", IBM J. of Res. & Dev., vol. 45, No. 1, 2001.

Kumar, et al., "Features of Gold Having Micrometer to Centimeter Dimensions can be Formed through a Combination of Stamping with an Elastomeric Stamp and an Alkanethiol "ink" followed by Chemical Etching", Applied Physics Letters, 63, 2002-2004, 1993.

Levy, G., et al., "An 852×600 Pixel OLED-on-Silicon Color Microdisplay Using CMOS Subtreshold-Voltage-Scaling Current Drivers", IEEE, 2002.

Murray, et al., Ph.D. Thesis entitled "Synthesis and Characterization of II-VI Quantum Dots and Their Assembly into 3-D Quantum Dot Superlattices", MIT, Sep. 1995.

Murray, et al., "Synthesis and Characterization of Nearly Monodisperse CdE (E=S, Se, Te) Semiconductor Nanocrystallites", J. Am. Chem. Soc., 115:8706 (1993).

PCT/US2007/03525 IPER—QD Vision, Inc., issued Aug. 12, 2008.

Santhanam, et al., "Microcontact Printing of Uniform Nanoparticle Arrays", Nano Letters, 4, 41-44, 2004.

Yamasaki, et al., "Organic Light-Emitting Device with an Ordered Monolayer of Silica Microspheres as a Scattering Medium", Appl. Phys. Lett. 76, 1243 2000.

Anikeeva et al., "Photoluminescence of CdSe/ZnS core/shell quantum dots enhanced by energy transfer from a phosphorescent donor", Chem, Phys. Lett., vol. 424 (2006), pp. 120-125.

Coe-Sullivan et al., "Large-Area Ordered Quantum-Dot Monolayers via Phase Separation During Spin-Casting", Adv. Funct. Mater., vol. 15 (2005), pp. 1117-1124.

Coe-Sullivan, et al., "Electroluminescence from single monolayers of nanocrystals in molecular organic devices", Nature, vol. 420, 19/26, Dec. 2002, pp. 800-803.

Coe-Sullivan et al., "Turning the performance of hybrid organic/inorganic quantum dot light-emitting devices", Organic Electronics, vol. 4 (2003), pp. 123-130.

Coe-Sullivan, "Hybrid Organic/Quantum Dot Thin Film Structures and Devices", MIT Thesis in partial fulfillment of Ph.D. in Electrrical Engineering and Computer Science (2005).

(56) References Cited

OTHER PUBLICATIONS

Coe-Sullilvan et al., "Method for fabrication of saturated RGB quantum dot light emitting devices", Proc. of SPIE, vol. 5739 (2005), pp. 108-115.

Steckel et al., "1.3 μm to 1.55 μm Tunable Electroluminescence from PbSe Quantum Dots Embedded within an Organic Device,", *Adv. Mater.*, vol. 15, No. 21, (2003), pp. 1862-1866.

Steckel et al., "Blue Luminescence from (CdS)ZnS Core-Shell Nanocrystals", *Angew. Chem. Int. Ed.*, vol. 43, (2004), pp. 2154-2158.

Steckel et al., "Color-Saturated Green-Emitting QD-LEDs", *Angew. Chem., Int. Ed.*, vol. 45, (2006), pp. 1-5.

Supran, et al., "QLEDs for displays and solid-state lighting", *MRS Bulletin*, vol. 38 (2013), pp. 703-711.

* cited by examiner

US 8,835,941 B2

DISPLAYS INCLUDING SEMICONDUCTOR NANOCRYSTALS AND METHODS OF MAKING SAME

CLAIM OF PRIORITY

This application claims priority to provisional U.S. Patent Application No. 60/771,643 filed 9 Feb. 2006, which is incorporated by reference in its entirety.

TECHNICAL FIELD OF THE INVENTION

The present invention relates to displays; and more particularly to displays including semiconductor nanocrystals.

BACKGROUND OF THE INVENTION

Light-emitting devices can be used, for example, in displays (e.g., flat-panel displays), screens (e.g., computer screens), and other items that require illumination.

Accordingly, the brightness of the light-emitting device is an important feature of the device. Also, low operating voltages and high efficiencies can improve the viability of producing emissive devices. In many applications, long device lifetime is desirable.

Light-emitting devices can release photons in response to excitation of an active component of the device. Emission can be stimulated by applying a voltage across the active component (e.g., an electroluminescent component) of the device. The electroluminescent component can be a polymer, such as a conjugated organic polymer or a polymer containing electroluminescent moieties or layers of organic molecules. Typically, the emission can occur by radiative recombination of an excited charge between layers of a device. The emitted light has an emission profile that includes a maximum emission wavelength, and an emission intensity, measured in luminance (candelas/square meter ($cd/m^2$) or power flux ($W/m^2$)). The emission profile, and other physical characteristics of the device, can be altered by the electronic structure (e.g., energy gaps) of the material. For example, the brightness, range of color, efficiency, operating voltage, and operating half-lives of light-emitting devices can vary based on the structure of the device.

SUMMARY OF THE INVENTION

In accordance with one aspect of the invention, there is provided a display comprising a substrate and a light-emitting device disposed on the substrate, wherein the substrate comprises a semiconducting material and a circuit useful for illuminating the light-emitting device, and wherein the light-emitting device comprises a light-emitting material and an electrode material in electrical connection with the light-emitting material on a side thereof remote from the substrate, the light-emitting material comprising semiconductor nanocrystals.

In one embodiment of the invention, the light-emitting device of the display further includes a charge transport layer disposed between the substrate and electrode.

In accordance with another aspect of the invention, there is provided a method of forming a display comprising disposing a light-emitting device comprising a light-emitting material comprising semiconductor nanocrystals on a substrate comprising a semiconducting material and a circuit such that the light-emitting device is in electrical connection with the circuit.

In accordance with a still further aspect of the invention, there is provided a method of forming a display comprising: depositing a light-emitting material comprising semiconductor nanocrystals over a substrate comprising a semiconducting material and a circuit, the light-emitting material being in electrical connection with the circuit; and depositing an electrode material over the deposited light-emitting material.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

The attached figures are simplified representations presented for purposed of illustration only; the actual structures may differ in numerous respects, particularly including the relative scale of the devices and components thereof.

For a better understanding to the present invention, together with other advantages and capabilities thereof, reference is made to the following disclosure and appended claims in connection with the above-described drawings.

DETAILED DESCRIPTION OF THE INVENTION

In accordance with one aspect of the invention, there is provided a display comprising a substrate and a light-emitting device disposed on the substrate. The substrate comprises a semiconducting material and a circuit useful for illuminating the light-emitting device. The light-emitting device comprises a light-emitting material and an electrode material in electrical connection with the light-emitting material on a side thereof remote from the substrate. The light-emitting material comprises semiconductor nanocrystals.

Figure 1:
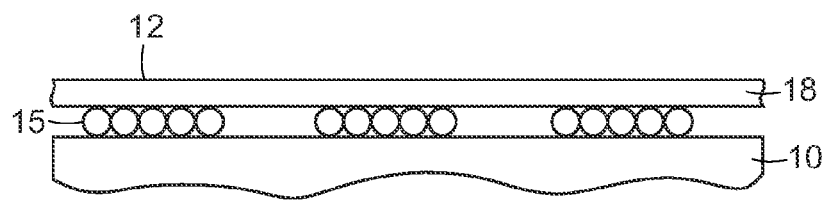
FIG. 1 is a schematic depicting an example of a cross section of one embodiment of a display of the invention.

An example of the structure of one embodiment of the invention is schematically shown in FIG. 1. In the depicted example, a light-emitting device 12 is disposed on a substrate 10 which comprises semiconducting material and a circuit (not shown) useful for illuminating the light-emitting device. In the example shown in FIG. 1, a layer of the light-emitting material 15 of the light-emitting device is in electrical connection with the circuit (not shown) and the electrode material 18, which is disposed as a layer on a surface of the light-emitting material that is opposite the substrate. The layer of electrode material and thickness of electrode is chosen to obtain desired conductive and optical properties.

While the example shown in FIG. 1 depicts a display including three light-emitting devices, a display can include one light-emitting device or a plurality of individual light-emitting devices formed at multiple locations on the substrate. Light-emitting devices can be prepared that emit far-visible, visible, near infra-red, or infra-red light. The size and material of the semiconductor nanocrystals included in the light-emitting material can be selected such that the semiconductor nanocrystal emits a photon at a predetermined wavelength of wavelength band in the far-visible, visible, infra-red or other desired portion of the spectrum. For example, the wavelength can be between 300 and 2,500 nm or greater, such as between 300 and 400 nm, between 400 and 700 nm, between 700 and 1100 nm, between 1100 and 2500 nm, or greater than 2500 nm.

The display can include light-emitting devices that emit light at the same or different wavelengths or wavelength bands. By patterning the substrate with arrays of different color (e.g., red, green, blue, infra-red, etc.) light-emitting materials, a display including light-emitting devices of different colors can be formed. The display can also be configured for still images, moving images, or lighting. A lighting display can provide white light, monochromatic light or polychromatic light.

In a monochromatic embodiment of the display, the light-emitting material in each light-emitting device is selected to emit at a predetermined wavelength or wavelength band for the desired color when energized. In a polychromatic embodiment of the display, for example, the light-emitting material included in the light-emitting devices emits at two or more different predetermined wavelengths or wavelength bands for the desired light output.

A single light-emitting device may also be referred to as a pixel. However, when, for example, a red light-emitting device, a green light-emitting device, a blue light-emitting, and/or infra-red light-emitting device are grouped together to form a polychromatic display, the grouping of devices may also be referred to as a pixel, and the individual red, green, blue, and/or infra-red light-emitting devices may alternatively be referred to as subpixels. A typical repeating grouping of subpixel colors included in displays for creating color images (still or moving) is red-, blue- and green. However, the subpixels can be formed to emit light at any predetermined wavelength or wavelength band and arranged in any pattern. Optionally, the grouping of light-emitting devices also includes an infra-red or other invisible light-emitting device.

Figure 5:
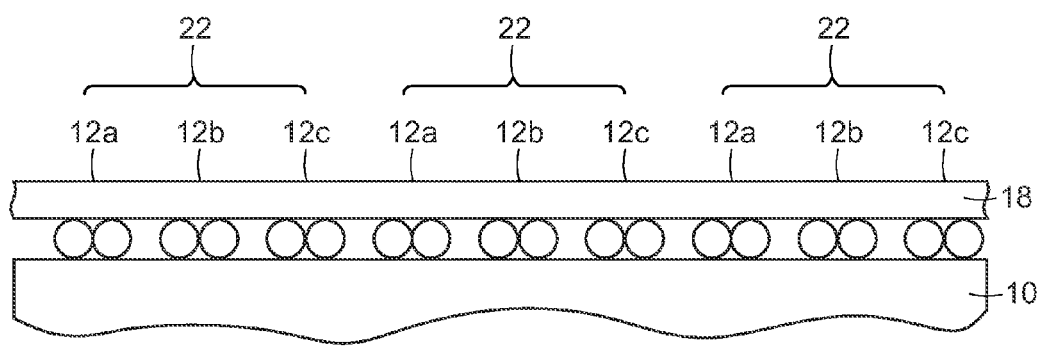
FIG. 5 is a schematic cross section of an example of an embodiment of a display of the invention including a plurality of light-emitting devices arranged on the substrate in repeating groups of light-emitting devices that emit light at different predetermined wavelengths or wavelength bands.

An example of an embodiment of a display of the invention which includes a plurality of light-emitting devices arranged on the substrate in repeating groups of light-emitting devices that emit light at different predetermined wavelengths or wavelength bands is shown in FIG. 5. In the example shown, light-emitting devices are included in the display in repeating groups 22 of light-emitting devices with each repeating group including, for example, three light-emitting devices 12a, 12b, and 12c that emit light at different predetermined wavelengths or wavelength bands.

The surface of the display opposite the substrate may optionally be completed by encapsulation with one or more layers of, e.g., polymer, glass, ceramic, and/or metal. When more than one layer is used, the layers may be the same or different materials.

Optionally, the viewing surface of the display can be anti-reflective e.g., by use of antireflective coating(s) or a polarizing filter, e.g., a circular polarizer.

In one embodiment of the display, electrical connections for connecting the light-emitting device to the circuit are optionally provided by including conductive contact regions (e.g., pads) deposited over contacts or interconnects at the surface of the substrate to the substrate circuitry.

A display can optionally further include optics or an optical system (e.g., simple refractive magnifiers to optics with stronger magnification and/or projection optics as the size of the display decreases (as in, e.g., near to eye micro-displays)) to increase the apparent size of the displayed image for the viewer.

The substrate of the display of the invention comprises semiconducting material. The substrate also includes a circuit, e.g., active, passive, or scanning mode. Preferably, the circuit is an active matrix that controls the light emission of the light-emitting device(s) disposed on the surface when appropriate voltage is applied across the device(s). In one example, the circuit comprises a two-dimensional addressable matrix.

The substrate may, for example, preferably be a semiconductor wafer (e.g., silicon or polysilicon) and most preferably include an integrated circuit(s), fabricated, for example, using CMOS technology. Other methods for forming the substrate circuit(s) can also be used.

The substrate can be opaque or transparent. However, if a silicon substrate is used, the substrate will be transparent to low energy in the infra-red portion of the spectrum but opaque to photons in the visible portion of the spectrum. If a silicon substrate is used, the silicon can be crystalline or polycrystalline.

Most preferably, the surface of the substrate on which the devices are disposed is flat or substantially flat. A semiconductor substrate surface that is not planar after fabrication of the active circuit may be planarized prior to the deposition of the other display materials. The planarization can optionally take place either as part of the manufacturing process of the integrated circuit or as a subsequent customization step.

An example of one approach for planarization of the surface of a substrate of an embodiment of the invention includes depositing a dielectric material on the surface of the substrate and creating vias from a metal or other conducting material, the vias being in electrical contact with the circuit to be used for controlling the light output of the light-emitting device(s) disposed on the substrate. Planarization is typically carried out, for example, using various well-recognized technologies typically used for such purposes (e.g., vapor deposition, spin-coating, photolithography, and chemical mechanical planarization technologies.) Other planarization technologies suitable for use with semiconductor fabrication can alternatively be used.

When the substrate is planarized and interconnects formed at or on the substrate surface, the light-emitting devices are disposed so as to be in electrical connection with the substrate circuit.

Figure 2:
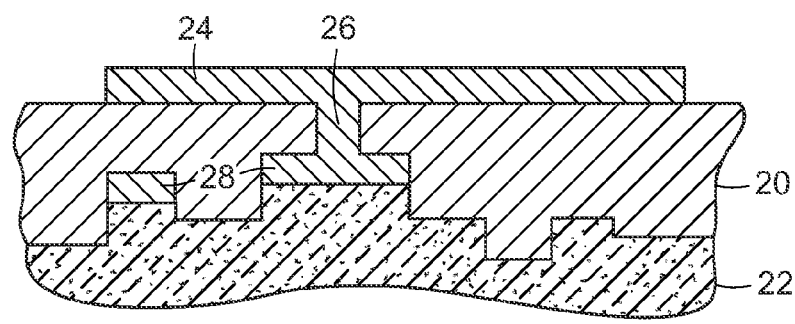
FIG. 2 is a schematic cross section of a planarized substrate of an example of an embodiment of the invention (not showing a complete light-emitting device).

As shown in one example of a planarized substrate in FIG. 2, the planarization is effected by depositing a dielectric 20, for example a polymeric material, on the surface of the substrate 22. Alternatively, a conducting polymer that can be patterned to create areas of insulation can be used for this purpose. A planarized electrode 24, which may comprise a metal or other conducting electrode material for connecting the light-emitting device (not shown) to an appropriate point in the circuit, can then be optionally deposited, the connection to the circuit then being established by a conducting via 26. Conductive portions of the integrated circuit are designated 28.

Additional interlayer structures may optionally be included between the substrate circuitry and the light-emitting device to be illuminated.

Depending on the relative work functions of the materials of the electrodes used to supply power to the light-emitting material of the light-emitting device, the conductive interconnect to the substrate circuitry or the electrode material of the light-emitting device may serve as the anode, with the other constituting the cathode. For example, if the substrate includes tungsten vias for interconnection with the substrate circuitry, the tungsten will act as the anode and the electrode material of the light-emitting device will act as the cathode.

Preferably, at least one surface of the display is light-transmissive. For example, if the substrate of the display is opaque, a material that is transmissive to the light emitted by the light-emitting device(s) is preferably used for forming the top electrode of the light-emitting device that is disposed over the light-emitting material opposite the substrate. Examples of electrode materials useful for forming an electrode that can at least partially transmit light in the visible region in the spectrum include conducting polymers, indium tin oxide (ITO) and other metal oxides, low or high work function metals, or conducting epoxy resins that are at least partially light transmissive. Most preferably, the light transmissive material is transparent to the light emitted from the devices. When a transparent electrode is desired, the electrode preferably is formed from a thin layer of electrode material, e.g., high work function metal, of a thickness that is adequately transparent and conductive.

An example of a conducting polymer that can be used as an electrode material is poly(ethlyendioxythiophene), sold by Bayer AG under the trade mark PEDOT. Other molecularly altered poly(thiophenes) are also conducting and could be used, as well as emaraldine salt form of polyaniline.

As used herein, "top" and "bottom" are relative positional terms, based upon a location from a reference point. More particularly, "top" means furthest away from the substrate, while "bottom" means closest to the substrate. For example, for a light-emitting device that optionally includes two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, the first layer is disposed further away from substrate. There may be other layers between the first and second layer, unless it is otherwise specified. For example, a cathode may be described as "disposed over" an anode, even though there are various organic and/or inorganic layers in between.

Examples of high work function (e.g., great than 4.0 eV) hole-injection conductor that could be used as an electrode material for an anode include, for example, tungsten, nickel, cobalt, platinum, palladium and their alloys, and possibly niobium, selenium, gold, chromium, tantalum, hafnium, technetium and their alloys, indium tin oxide (ITO), include gallium indium tin oxide, zinc indium tin oxide, titanium nitride, polyaniline, or other high work function hole-injection conducting polymers. In which case, the second electrode would be the cathode. Examples of low work function (e.g., less than 4.0 eV), electron-injection materials that could be used as a cathode material include metals such as Al, Ba, Yb, Ca, a lithium-aluminum alloy (Li:Al), lithium-fluoride (Li:F) or a magnesium-silver alloy (Mg:Ag).

Non-polymeric electrode materials can be deposited by, for example, sputtering or evaporating. Polymeric electrode materials can be deposited by, for example, spin-casting.

Optionally, the electrode can be patterned. Electrode material, including light-transmittable electrode material, can be patterned by, for example, a chemical etching method such as a photolithography or a physical etching method using laser, etc. Also, the electrode may be patterned by vacuum vapor deposition, sputtering, etc. while masking.

The electrodes of the display can be connected to a voltage source by electrically conductive pathways. Upon application of the voltage, light is generated from the device.

Figure 3:
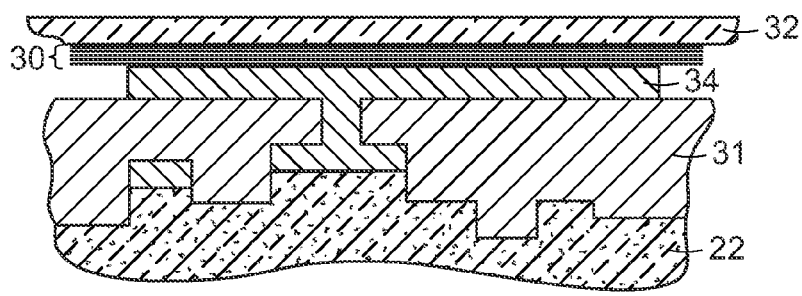
FIG. 3 is a schematic cross section of an example of an embodiment of the invention including an alternative substrate.

FIG. 3 shows an alternative arrangement in which an electrode 34 is recessed in the dielectric 31 surface, i.e. full planarization is achieved.

FIG. 3 also shows one way in which the display construction can be completed. The components 30 of the desired light-emitting device (e.g. electrode material, light-emitting material, and optional charge transport layer(s)) are deposited and the display is sealed, e.g., by covering with glass 32.

As discussed above, the light-emitting material included in the light-emitting device(s) of the display comprises semiconductor nanocrystals. Semiconductor nanocrystals are nanometer-scale inorganic semiconductor particles. Semiconductor nanocrystals included in the light-emitting material of the invention preferably have an average nanocrystal diameter less than about 150 Angstroms (Å), and most preferably in the range of 12-150 Å.

Semiconductor nanocrystals include, for example, inorganic crystallites between about 1 nm and about 1000 nm in diameter, preferably between about 2 nm and about 50 um, more preferably about 5 nm to about 20 nm (such as about 6, 7, 8, 9, 10, 11, 12, 13, 14, 15, 16, 17, 18, 19, or 20 nm).

The semiconductor forming the nanocrystals comprises Group II-VI compounds, Group II-V compounds, Group III-VI compounds, Group III-V compounds, Group IV-VI compounds, Group I-III-VI compounds, Group II-IV-VI compounds, or Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof, including ternary and quaternary mixtures.

Examples of the shape of the semiconductor nanocrystals included in the light-emitting material include sphere, rod, disk, other shape or mixtures thereof.

Preferably, the semiconductor nanocrystals preferably include a "core" of one or more first semiconductor materials, and which may be surrounded by an overcoating or "shell" of a second semiconductor material. A semiconductor nanocrystal core surrounded by a semiconductor shell is also referred to as a "core/shell" semiconductor nanocrystal.

For example, the semiconductor nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as semiconductor nanocrystal cores include, but are not limited to, CdS, CdSe, CdTe, ZnS, ZnSe, ZnTe, MgTe, GaAs, GaP, GaSb, GaN, HgS, HgSe, HgTe, InAs, InP, InSb, InN, AlAs, AlP, AlSb, AlS, PbS, PbSe, Ge, Si, alloys thereof, and/or mixtures thereof, including ternary and quaternary mixtures.

In one embodiment, the surrounding "shell" material can have a bandgap greater than the bandgap of the core material and can be chosen so as to have an atomic spacing close to that of the "core" substrate. In another embodiment, the surrounding shell material can have a bandgap less than the bandgap of the core material. In a further embodiment, the shell and core materials can have the same crystal structure. Shell materials are discussed further below. For further examples of core/shell semiconductor nanocrystal structures, see U.S. application Ser. No. 10/638,546, entitled "Semiconductor Nanocrystal Heterostructures", filed 12 Aug. 2003, which is hereby incorporated herein in its entirety.

The semiconductor nanocrystals included in the light-emitting material are preferably members of a population of semiconductor nanocrystals having a narrow size distribution. More preferably, the semiconductor nanocrystals of a particular light-emitting material preferably comprise a monodisperse or substantially monodisperse population of semiconductor nanocrystals. Most preferably, the semiconductor nanocrystals of a particular light-emitting material comprise a monodisperse or substantially monodisperse population of semiconductor nanocrystals and are preferably included in the light-emitting device as a monolayer. When included as a monolayer, preferably at least about 60% of the semiconductor nanocrystals are at single monolayer thickness, more preferably, at least about 80% of the semiconductor nanocrystals are at single monolayer thickness, and most preferably, at least about 90% of the semiconductor nanocrystals are at single monolayer thickness. The light-emitting material is optionally deposited in a pattern.

Semiconductor nanocrystals show strong quantum confinement effects that can be harnessed in designing bottom-up chemical approaches to create complex heterostructures with electronic and optical properties that are tunable with the size and composition of the nanocrystals.

Preparation and manipulation of semiconductor nanocrystals are described, for example, in U.S. Pat. Nos. 6,322,901 and 6,576,291, and U.S. Patent Application No. 60/550,314, each of which is hereby incorporated herein by reference in its entirety. One method of manufacturing a semiconductor nanocrystal is a colloidal growth process. Colloidal growth occurs by injection an M donor and an X donor into a hot coordinating solvent. One example of a preferred method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals obtained has a narrow, monodisperse distribution of diameters. The monodisperse distribution of diameters can also be referred to as a size. Preferably, a monodisperse population of particles includes a population of particles wherein at least 60% of the particles in the population fall within a specified particle size range. A population of monodisperse particles preferably deviate less than 15% rms (root-mean-square) in diameter and more preferably less than 10% rms and most preferably less than 5%.

The narrow size distribution of the semiconductor nanocrystals allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 entitled "Highly Luminescent Color-selective Materials" which are hereby incorporated in their entireties by reference.

The process of controlled growth and annealing of the semiconductor nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened. The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide ((TMS)$_2$Se), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-noctylphosphine) sulfide (TOPS), an ammonium salt such as an ammonium halide (e.g., NH4Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A coordinating solvent can help control the growth of the semiconductor nanocrystal. The coordinating solvent is a compound having a donor lone pair that, for example, has a lone electron pair available to coordinate to a surface of the growing semiconductor nanocrystal. Solvent coordination can stabilize the growing semiconductor nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. Examples of suitable coordinating solvents include pyridine, tri-n-octyl phosphine (TOP), tri-n-octyl phosphine oxide (TOPO) and trishydroxylpropylphosphine (tHPP). Technical grade TOPO can be used.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

As discussed above, preferably the semiconductor nanocrystals of the light-emitting material have a core/shell structure in which the core includes an overcoating on a surface of the core. The overcoating (also referred to as the shell) can be a semiconductor material having a composition that is the same as or different from the composition of the core. The overcoat of a semiconductor material on a surface of the core semiconductor nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, alloys thereof, and/or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers The overcoating comprises at least one semiconductor material which is the same as or different from the composition of the core. Preferably, the overcoating has a thickness of from about one to about ten monolayers.

The particle size distribution of the semiconductor nanocrystals can be further refined by size selective precipitation with a poor solvent for the semiconductor nanocrystals, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

In certain embodiments, the semiconductor nanocrystals have ligands attached thereto.

In one embodiment, the ligands are derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a suspension or dispersion medium. Such affinity improves the stability of the suspension and discourages flocculation of the semiconductor nanocrystal.

More specifically, the coordinating ligand can have the formula:

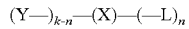

wherein k is 2, 3 or 5, and n is 1, 2, 3, 4 or 5 such that k-n is not less than zero; X is O, S, S=O, SO2, Se, Se=O, N, N=O, P, P=O, As, or As=O; each of Y and L, independently, is aryl, heteroaryl, or a straight or branched C2-12 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry, which is incorporated by reference in its entirety.

See also U.S. patent application Ser. No. 10/641,292 entitled "Stabilized Semiconductor Nanocrystals", filed 15 Aug. 2003, which is hereby incorporated herein in its entirety.

When the electron and hole localize on a semiconductor nanocrystal, emission can occur at an emission wavelength. The emission has a frequency that corresponds to the band gap of the quantum confined semiconductor material. The band gap is a function of the size of the semiconductor nanocrystal. Semiconductor nanocrystals having small diameters can have properties intermediate between molecular and bulk forms of matter. For example, semiconductor nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of semiconductor nanocrystals shift to the blue, or to higher energies, as the size of the crystallites decreases.

For an example of blue light-emitting semiconductor nanocrystal materials, see U.S. patent application Ser. No. 11/071,244, filed 4 Mar. 2005, which is hereby incorporated herein in its entirety.

The emission from the semiconductor nanocrystal can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, CdSe can be tuned in the visible region and InAs can be tuned in the infra-red region. The narrow size distribution of a population of semiconductor nanocrystals can result in emission of light in a narrow spectral range. The population can be monodisperse preferably exhibits less than a 15% rms (root-mean-square) deviation in diameter of the semiconductor nanocrystals, more preferably less than 10%, most preferably less than 5%. Spectral emissions in a narrow range of no greater than about 75 nm, preferably 60 nm, more preferably 40 nm, and most preferably 30 nm full width at half max (FWHM) for semiconductor nanocrystals that emit in the visible can be observed. IR-emitting semiconductor nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of semiconductor nanocrystal diameters decreases. Semiconductor nanocrystals can have high emission quantum efficiencies such as greater than 10%, 20%, 30%, 40%, 50%, 60%, 70%, or 80%.

The narrow FWHM of semiconductor nanocrystals can result in saturated color emission. This can lead to efficient semiconductor nanocrystal light-emitting devices even in the red and blue parts of the visible spectrum, since in semiconductor nanocrystal emitting devices no photons are lost to infra-red and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A device including more than one size of semiconductor nanocrystal can emit light in more than one narrow range of wavelengths. The color of emitted light perceived by a viewer can be controlled by selecting appropriate combinations of semiconductor nanocrystal sizes and materials in the device as well as relative subpixel currents. The degeneracy of the band edge energy levels of semiconductor nanocrystals facilitates capture and radiative recombination of all possible excitons, whether generated by direct charge injection or energy transfer. The maximum theoretical semiconductor nanocrystal light-emitting device efficiencies are therefore comparable to the unity efficiency of phosphorescent organic light-emitting devices. The excited state lifetime ($\tau$) of the semiconductor nanocrystal is much shorter ($\tau$~10 ns) than a typical phosphor ($\tau$>0.1 µs), enabling semiconductor nanocrystal light-emitting devices to operate efficiently even at high current density and high brightness.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

The light-emitting device of the display of the invention can optionally further include a charge transport layer disposed between the substrate and the electrode. Alternatively, two or more charge transport layers can optionally be disposed between the substrate and electrode. The light-emitting material can be included in a charge transport layer. Alternatively, a separate layer comprising light-emitting material can be included. For example, in an embodiment including more than one charge transport layer, a light-emitting layer can be disposed between two charge transport layers; in an embodiment including one charge transport layer, a light-emitting layer can be disposed between the substrate and the charge transport layer or between the charge transport layer and the electrode. Optionally, charge transport material may be patterned.

A charge transport layer comprises either a hole transport material or an electron transport material. For purposes of the following discussion, a charge transport layer comprising a hole transport material will be referred to as a hole transport layer ("HTL") and a charge transport layer comprising an electron transport material will be referred to as an electron transport layer ("ETL"), although each type of material can alternatively be patterned or used in another structural form. A hole transport layer is typically adjacent to the cathode of the device and an electron transport layer is typically adjacent to the anode of the device. The relative locations of the hole transport layer and electron transport layer in the light-emitting device will be influenced by the locations of the anode or cathode of the device. The charge transport layer can optionally be undoped or doped (e.g., by including a dopant).

A hole transport layer comprises a material capable of transport holes. A hole transport layer may be intrinsic (undoped) or doped. Doping may optionally be used to enhance conductivity.

An electron transport layer comprises a material capable of transport electrons. Electron transport layer may be intrinsic (undoped) or doped.

In general, a dopant can be a p-type or an n-type dopant. An HTL, for example, can include a p-type dopant. An ETL, for example, can include an n-type dopant.

When a voltage is applied to the anode and cathode of an embodiment of the invention including a light-emitting device which further includes an HTL and an ETL, the anode inject holes into the hole transport layer, while the cathode inject electrons into the electron transport layer. The injected holes and electrons migrate toward the oppositely charged electrode. When an electron and hole localize in the same semiconductor nanocrystal of the light-emitting material, an exciton is formed, which can recombine to emit light.

In addition to the charge transport layers, a light-emitting device may optionally further include a hole-injection layer (either as a separate layer or as part of the hole transport layer) and/or an electron-injection layer (either as a separate layer as part of the electron transport layer). The lighting-emitting device may also optionally include a plurality of hole transport layers (which may comprise the same or different hole transport material) and/or a plurality of electron transport layers (which may comprise the same or different electron transport material).

A charge transport layer may comprise organic or inorganic materials. For example, in a device including a first and second charge transport layer, both charge transport layers may comprise organic materials; both may comprise inorganic materials; or one may comprise an organic material and the other may comprise an inorganic material. Each charge transport layer may further comprise polymeric or non-polymeric material.

Charge transport layers comprising organic materials and other information related to display fabrication are discussed in more detail in U.S. patent application Ser. Nos. 11/253,612 entitled "Method And System For Transferring A Patterned Material", filed 21 Oct. 2005, and 11/253,595 entitled "Light Emitting Device Including Semiconductor Nanocrystals", filed 21 Oct. 2005, each of which is hereby incorporated herein by reference in its entirety.

Organic charge transport layers of the device may be disposed by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Most preferably, the organic layers are deposited at high vacuum conditions of from about $1 \times 10^{-7}$ to about $5 \times 10^{-6}$ torr. Alternatively, organic layers may be formed by multi-layer coating while appropriately selecting solvent for each layer.

As discussed above, the HTL and/or the ETL layers may comprise inorganic material, such as an inorganic semiconductor. The inorganic material can be amorphous or polycrystalline.

Charge transport layers including inorganic materials and other information related to display fabrication are discussed further below and in more detail in U.S. Patent Application No. 60/653,094 entitled "Light Emitting Device Including Semiconductor Nanocrystals, filed 16 Feb. 2005, the disclosure of which is hereby incorporated herein by reference in its entirety.

Examples of suitable inorganic semiconductors include metal chalcogenides, such as a metal oxide, and other inorganic semiconductors that can form a light-transmissive layer and have a bandgap greater than the bandgap of the emission energy of the light-emitting material. Examples include zinc oxide, titanium oxide, niobium oxide, indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, a zinc sulfide, zinc selenide, zinc telluride, cadmium sulfide, cadmium selenide, cadmium telluride, mercury sulfide, mercury selenide, mercury telluride, silicon carbide, diamond (carbon), silicon, germanium, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride, iron sulfide, indium selenide, indium sulfide, indium telluride, gallium sulfide, gallium selenide, gallium telluride, tin selenide, tin telluride, tin sulfide, magnesium sulfide, magnesium selenide, magnesium telluride, and/or mixtures thereof, e.g., ITO. The inorganic semiconductor can be doped or undoped. For example, with a metal oxide, the doping can be, for example, an oxygen deficiency, a halogen dopant, or a mixed metal.

Charge transport layers comprising an inorganic semiconductor can be deposited on a substrate at a low temperature, for example, by a known method, such as a vacuum vapor deposition method, an ion-plating method, sputtering, inkjet printing, etc.

An example of sputtering includes applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate. The substrate (i.e., the device being manufactured) is cooled or heated for temperature control during the growth process. The temperature affects the crystallinity of the deposited material as well as how it interacts with the surface it is being deposited upon. The deposited material can be polycrystalline or amorphous. The deposited material can have crystalline domains with a size in the range of 10 Angstroms to 1 micrometer. Doping concentration can be controlled by varying the gas, or mixture of gases, which is used for the sputtering plasma. The nature and extent of doping can influence the conductivity of the deposited film, as well as its ability to optically quench neighboring excitons. By growing one material on top of another, diodes can be created that are p-n or p-i-n or p-i-n-i-n or other combinations. A device can be optimized for delivery of charge to a semiconductor nanocrystal monolayer.

Figure 4:
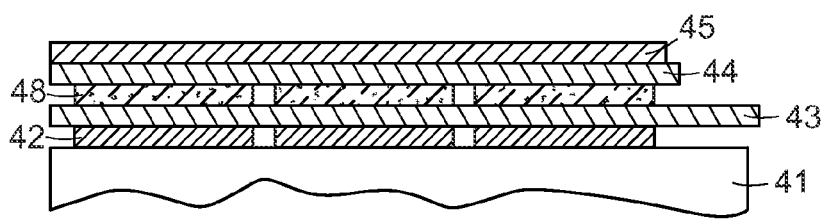
FIG. 4 is a schematic cross section of an example of an embodiment of a display of the invention.

In embodiments of the invention including light-emitting devices that include charge transport layers, the light-emitting material may be disposed as a layer between the charge transport layers. An example of a structure of the invention which includes charge transport layers is shown in FIG. 4, in which a plurality of light-emitting devices are disposed on a substrate 41 of a semiconducting material which includes an active circuit (not shown) for illuminating each light-emitting device. The light-emitting devices disposed on the substrate 41 each comprised a first charge transport layer 43 in contact with the interconnect 42, semiconductor nanocrystals 48, at least a portion of which are in contact with the first charge transport layer, a second charge transport layer 44 opposed to the first charge transport layer and in contact with at least a portion of the semiconductor nanocrystals, and a blanket electrode 45 in contact with the second charge transport layer. (The interconnect 42 on the substrate acts as an electrode material for the light-emitting device and provides electrical connection with the active circuit.) When the interconnect and electrode are in contact with a power supply (not shown) and voltage of proper polarity is provided across the structure, electroluminescence is produced by the light-emitting material of the display.

In the example of the embodiment depicted in FIG. 4, the light-emitting material 48 is included between the first charge transport layer (in this embodiment, a hole transport layer) 43 and the second charge transport layer (in this embodiment, an electron transport layer) 44. The light-emitting material 48 includes semiconductor nanocrystals, preferably a substantially monodisperse population of semiconductor nanocrystals.

In the structure shown in FIG. 4, for example, the first charge transport layer can have a thickness of about 50 Angstroms to about 5 micrometers, such as a thickness in the range of about 100 Angstroms to about 100 nm, about 100 nm to about 1 micrometer, or about 1 micrometer to about 5 micrometers. The second charge transport layer can have a thickness of about 50 Angstroms to about 5 micrometers, such as a thickness in the range of about 100 Angstroms to about 100 nm, about 100 nm to about 1 micrometer, or about 1 micrometer to about 5 micrometers. The electrode can have a thickness of about 10 Angstroms to greater than about 5 micrometer, preferably from about 1,000 Angstroms to about 5 micrometers.

Examples of various alternative embodiments of multi-layer structures useful in the light-emitting device of the invention include, without limitation: anode (positive electrode)/light-emitting layer/cathode (negative electrode); anode/hole transport layer/light-emitting layer/cathode; anode/light-emitting layer/electron transport layer/cathode; anode/hole transport layer/light-emitting layer/electron transport layer/cathode; the reversed structure thereof; etc. Additional hole transport and/or electron transport layers may also optionally be included. As discussed a hole-injection layer and an electron-injection layer may be further included. Also, as discussed above, the function of one of the electrodes of the structure can be performed by the electrical connection between the light-emitting material and the substrate circuit.

One or more blocking layers may still further optionally be included. For example, an electron blocking layer (EBL), a hole blocking layer (HBL), or an exciton blocking layer (eBL), can be introduced in the structure. A blocking layer can include, for example, 3-(4-biphenylyl)-4-phenyl-5-tert butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-Nphenylamino} triphenylamine (m-MTDATA), polyethylene dioxythiophene (PEDOT), 1,3-bis(5-(4-diphenylamino) phenyl-1,3,4-oxadiazol-2-yl)benzene, 2-(4-biphenyl)yl)-5-(4-tertbutylphenyl)-1,3,4-oxadiazole, 1,3-bis[5-(4-(1,1-dimethylethyl)phenyl)-1,3,4-oxadiazol-5,2-yl)benzene, 1,4- bis(5-(4-diphenylamino)phenyl-1,3,4-oxadiazol-2-yl) benzene, or 1,3,5-tris[5-(4-(1,1-dimethylethyl)phenyl)-1,3,4-oxadiazol-2-yl)benzene.

Other multilayer structures may optionally be used to improve the performance (see, for example, U.S. patent application Ser. Nos. 10/400,907 and 10/400,908, filed Mar. 28, 2003, each of which is incorporated by reference in its entirety) of the light-emitting devices and displays of the invention. The performance of light-emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety.

The light-emitting devices are preferably made in a controlled (oxygen-free and moisture-free) environment, preventing the quenching of luminescent efficiency during the fabrication process.

Light-emitting devices including a light-emitting material comprising semiconductor nanocrystals can be made, for example, by spin-casting a solution containing HTL organic semiconductor molecules and the light-emitting material comprising semiconductor nanocrystals, where the HTL forms underneath the semiconductor nanocrystal monolayer via phase separation (see, for example, U.S. patent application Ser. Nos. 10/400,907 and 10/400,908, both filed Mar. 28, 2003, each of which is incorporated herein by reference in its entirety). Other techniques for depositing semiconductor nanocrystals include Langmuir-Blodgett techniques and drop-casting. Some techniques for depositing semiconductor nanocrystal monolayers may not be well suited for all possible substrate materials, may involve use of chemicals that can affect the electrical or optical properties of the layer, may subject the substrate to harsh conditions, and/or may place constraints on the types of devices that can be grown in some way.

A preferred technique for depositing a light-emitting material comprising semiconductor nanocrystals in a pattern and/or in a multi-color pattern or other array is contact printing. Contact advantageously allows micron-scale (e.g., less than 1 mm, less than 500 microns, less than 200 microns, less than 100 microns, less than 50 microns, less than 25 microns, or less than 10 microns) patterning of features on a surface. Pattern features can also be applied at larger scales, such as 1 mm or greater, 1 cm or greater, 1 m of greater, 10 m or greater. This approach allows dry (i.e., solvent free) application of a patterned semiconductor nanocrystal layer to a surface. Examples of typical pixel sizes for a full color display are typically in the range of from about 100 to about 1,000 microns, such as, on the order of about 100 microns, about 300 microns, or about 1,000 microns. In instances where a pixel includes subpixels, the sizes of the subpixels are typically a proportionate fraction of the pixel size, based on the number of subpixels. Pixel sizes for a full color micro-display, for example, are typically on the order of about 10 to about 30 microns. In instances where a pixel includes subpixels, the sizes of the subpixels are typically a proportionate fraction of the pixel size, based on the number of subpixels.

Contact printing of various color light-emitting material comprising semiconductor nanocrystals (e.g., red (e.g., (CdSe)ZnS (core)shell), etc., green (e.g., (CdZnSe)CdZnS (core)shell, etc.), blue (e.g., (CdS)CdZnS (core)shell, etc., near infra-red (PbSe, etc.) can be used to make arrays of light-emitting devices light-emitting devices that emit at predetermined color regions of the spectrum, preferably with saturated color, to place multiples of such predetermined color light-emitting devices onto a single surface, and to form patterns of the light-emitting devices at a variety of scales, including, e.g., the micron scale. The deposition is scalable.

Contact printing and related techniques are described in, for example, U.S. Pat. Nos. 5,512,131; 6,180,239; 6,518,168, and U.S. patent application Ser. Nos. 11/253,612 entitled "Method And System For Transferring A Patterned Material", filed 21 Oct. 2005, and 11/253,595 entitled "Light Emitting Device Including Semiconductor Nanocrystals", filed 21 Oct. 2005, each of which is incorporated by reference in its entirety.

With contact printing, the light-emitting material comprising semiconductor nanocrystals is applied to a predefined region of the surface onto which the material is to be deposited. See, for example, A. Kumar and G. Whitesides, *Applied Physics Letters*, 63, 2002-2004, (1993) and V. Santhanam and R. P. Andres, *Nano Letters*, 4, 41-44, (2004), each of which is hereby incorporated herein by reference in its entirety. The predefined region is a region on the substrate where the material is selectively applied. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material. When different light-emitting materials are printed, the different materials are preferably printed separately. For example, if red light-emitting material and green-light-emitting material are being printed, the red light-emitting material would be printed before or after the green light-emitting material is printed, rather than at the same time.

In general, contact printing begins by forming a patterned mold. The mold has a surface with a pattern of elevations and depressions. A stamp or other applicator is formed with a complementary pattern of elevations and depressions, for example by coating the patterned surface of the mold with a liquid polymer precursor that is cured while in contact with the patterned mold surface. The stamp or other applicator can then be inked; that is, the stamp or other applicator is contacted with a material which is to be deposited on the surface to be printed. The material becomes reversibly adhered to the stamp or other applicator. The inked stamp is then contacted with the surface to receive the patterned ink. The elevated regions of the stamp or other applicator can contact the substrate while the depressed regions of the stamp can be separated from the printing surface. Alternatively, a featureless stamp or other application can be used to deposit the pattern. When using a featureless (substantially free of elevations and depressions) stamp or other applicator, the desired pattern can be formed on the surface of the stamp or other applicator by ink-jet printing, spin coating, blade coating, slot coating, dip coating, spray coating, rod coating, reverse roll coating, forward roll coating, air knife coating, knife over roll coating, microgravure, extrusion coating, slide coating curtain coating, or a combination thereof. Other known techniques for applying a pattern to the surface of a featureless stamp or other applicator may optionally be used. The stamp or other application may also optionally be mounted on a rotatable drum or device. Thereafter the pattern is transferred to the surface to receive the patterned ink. Where the inked stamp contacts the receiving surface, the ink material (or at least a portion thereof) is transferred from the stamp to the receiving surface.

An example of a contact printing process includes, first, making a silicon master using standard semiconductor processing techniques which define a pattern on the silicon surface, for example a pattern of elevations and depressions (alternatively, for a non-patterned deposition, a blank Si master can be used). Poly dimethyl siloxane (PDMS, for example Sylgard 184) precursors are then mixed, degassed, poured onto the master, and degassed again, and allowed to cure at room temperature (or above room temperature, for faster cure times). The PDMS stamp, having a surface including the pattern of the silicon master, is then freed from the master, and cut into the desired shape and size. This stamp is then optionally coated with a surface chemistry layer, selected to readily adhere and release the ink as needed. For example the surface chemistry layer can be a chemical vapor deposited Parylene-C layer. The Parylene-C layer can be, for example, 0.1 to 2 microns Hm thick, depending on the pattern to be reproduced. This stamp is then inked with a dispersion of the light-emitting material comprising semiconductor nanocrystals using, for example, any of the stamp inking techniques listed above. The dispersion can have, for example, a concentration of 1-10 mg/mL in chloroform. The concentration can be varied depending on desired outcome. The inked stamp can then be contacted to the surface onto which the ink is to be transferred, and gentle pressure applied, e.g., for 30 seconds, to transfer the ink (i.e., a semiconductor nanocrystal monolayer) completely thereto. After the patterned semiconductor nanocrystal monolayer is transferred to the receiving surface (e.g., the optional HTL layer or the substrate of the display), the remaining materials of the light-emitting device (e.g., optional electron transport layer (ETL), optional electron injection layer (EIL), and electrode material) can then be added.

For further related information, see, for example, U.S. Patent Application Nos. 60/620,967, filed Oct. 22, 2004, and 11/032,163, filed Jan. 11, 2005, each of which is incorporated by reference in its entirety.

An example of a method for forming a display of the invention including an inorganic charge transport layer, e.g., a p-type semiconductor such as, for example, NiO is deposited on the interconnect of a semiconducting substrate which includes an active surface and an interconnect which will function as an anode. Optionally, substrate is transparent. Then, the light-emitting material comprising semiconductor nanocrystals are deposited using a large-area compatible, single monolayer deposition technique such as micro-contact printing or a Langmuir-Blodgett (LB) technique. Subsequently, an n-type semiconductor (e.g., ZnO or, $TiO_2$) is applied, for example by sputtering, on top of this layer. A metal electrode can be thermally evaporated over this to complete the device.

More complicated device structures are also possible. For example, a lightly doped, intrinsically doped, or compensation doped layer can be included proximal to the semiconductor nanocrystal layer, to minimize non-radiative losses due to exciton quenching by unbound charge carriers in the transport layers.

Alternatively, the device can be assembled by separately growing the two transport layers, and physically applying the electrical contacts using an elastomer such as polydimethyl-siloxane (PDMS). This avoids the need for direct deposition of material on the semiconductor nanocrystal layer. The device can be thermally treated after application of all of the transport layers. The thermal treatment can further enhance injection of charges into the semiconductor nanocrystals, as well as eliminate the organic capping groups on the semiconductor nanocrystals. The instability of the capping groups can contribute to device instability.

When inorganic transport layers are used, in particular metal-oxide (MO) materials, they can act as barrier layers to prevent $O_2$ and $H_2O$ from entering active layer of the device (the semiconductor nanocrystal layer). Encapsulant coatings such as BARIX (made by Vitex) are made using alternating layers of MOs and polymers. In such barriers, the MOs are the barriers to $O_2$ and $H_2O$, and the polymer layers randomize the occurrences of pin hole defects in the MO layers. Thus, in using MO materials as transport layers, the device itself functions as a protective layer to the semiconductor nanocrystals. Light-emitting devices that include inorganic transport materials can have inherently lower voltages than devices prepared with organic transport materials, due to the high conductivity of the doped inorganic semiconductors, increased lifetimes, and improved efficiency.

The viewing surface of the display may be completed by encapsulation with a further layer of polymer or glass.

As discussed above, the viewing surface of the display can optionally be anti-reflective e.g., by use of antireflective coating(s), a polarizer, a circular-polarizer, etc.

In accordance with one example of an embodiment of the invention, there is provided a method of forming a display comprising: depositing a light-emitting material comprising semiconductor nanocrystals over a substrate comprising a semiconducting material and an active matrix circuit with interconnects at the surface of the substrate, the light-emitting material being in electrical connection with the active matrix circuit; and depositing an electrode material over the deposited light-emitting material.

In another example, the method further optionally includes steps of depositing a first charge transport layer over the substrate before depositing the light-emitting material, and depositing a second charge transport layer over the deposited light-emitting layer, before the electrode material is deposited.

In a further example of the method, the display materials are deposited as blanket films without patterning, with the exception of the light-emitting material, which is deposited by contact printing. Contact printing permits singulation of the colored sub pixels without the use of photolithography.

The display and method of the invention are particularly advantageous for use in micro-displays, especially those for use in near eye applications. A microminiaturized display or micro-display typically includes a flat panel display with a screen size less than 1.5" diagonal, viewed through the use of magnification or projection optics.

The structure and materials and optional features of the light-emitting devices of the micro-display and the micro-display are as set forth above. The size of the displays, however, is miniaturized. For instance, as discussed above, examples of typical pixel sizes for a full color display are typically in the range of from about 100 to about 1,000 microns, such as, on the order of about 100 microns, about 300 microns, or about 1,000 microns. In instances where a pixel includes subpixels, the sizes of the subpixels are typically a proportionate fraction of the pixel size, based on the number of subpixels. In comparison, examples of pixel sizes for a full color micro-display, for example, are typically on the order of about 10 to about 30 microns. In instances where a pixel includes subpixels, the sizes of the subpixels are typically a proportionate fraction of the pixel size, based on the number of subpixels. The image created is typically a high resolution image. Micro-displays are used, for example, in head mounted displays (HMDs) and in the traditional viewfinders of digital cameras. Micro-displays are also used in projection applications (e.g., data projectors, rear screen projectors, etc.), video games, headsets, etc. In addition, these displays are well suited for any application requiring low power and light weight in either monochrome or full color. Examples of end-use applications for HMDs include simulation, night vision, range finding, thermal imaging, etc.

As discussed above, making displays of the invention is not limited by the process or materials constraints of other display technologies. Additionally, for example, by constructing a light-emitting device with a thickness of approximately 100 nm thick, problematic current spreading that can occur at light-emitting device sizes on the order of 200 nm or less can be improved.

Micro-displays typically include or are use with magnifiers or optics, e.g., prismatic optics. The inclusion of optics in micro-displays can be used to create a virtual image that appears to the wearer to be the size of a large video display (e.g. 42 in diagonal) located, for example, 7 ft or more in front of the viewer. For example, micro-displays including prismatic optics are particularly well-suited for use in a monocle device which allows the viewer to obtain the virtual image in one eye, while seeing the real-life view through the other. An example of optics and/or optical systems for a head mounted micro-display includes an off-axis, non-rotational a sphere.

The viewing surface of the micro-display may be completed by encapsulation with a further layer of polymer or glass.

The viewing surface of the micro-display can optionally be anti-reflective e.g., by use of antireflective coating(s), a polarizer, a circular-polarizer, etc.

In addition to other features and advantages offered by the present invention, the present invention further advantageously provides the direct generation of light of various colors without requiring any additional color converting components, such as, for example, filters or the inclusion of any other luminescent material. This represents an advance over the use of organic light-emitting diodes (OLEDs). For a discussion of OLEDs in, for example, micro-displays, see W. E. Howard et al., "Microdisplays Based Upon Organic Light-Emitting Diodes", IBM J. OF RES. & DEV., Vol. 45, Number 1 Jan. 2001, pages 115-127, which is hereby incorporated herein by reference.

It is further expected that because the displays of the invention emit color on a pixel-by-pixel basis, without requiring color conversion, there is no inherent power loss in generating color.

All the patents and publications mentioned above and throughout are incorporated in their entirety by reference herein.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A display comprising a substrate and a plurality of light-emitting devices disposed on the substrate, wherein the substrate is a semiconductor wafer including an integrated circuit useful for illuminating the light-emitting devices, and wherein a light-emitting device comprises a light-emitting material comprising semiconductor nanocrystals selected to emit electroluminescent light at a predetermined wavelength or wavelength band and an electrode material in electrical connection with the light-emitting material on a side thereof remote from the substrate, and wherein electroluminescent light emitted by the plurality of light-emitting devices includes directly generated electroluminescent light at two or more different predetermined wavelengths or wavelength bands for a desired light output, wherein the display does not further include a color converting luminescent material.

2. A display in accordance with claim 1 wherein the semiconductor nanocrystals comprise a core/shell structure.

3. A display in accordance with claim 1 wherein the semiconductor wafer comprises silicon or polysilicon.

4. A display in accordance with claim 3 wherein the electrode material comprises light transmissive material.

5. A display in accordance with claim 4 wherein the circuit is an active matrix circuit.

6. A display in accordance with claim 5 wherein interconnects are deposited between each light-emitting device and its electrical connection with the active matrix circuit of the substrate.

7. A display in accordance with claim 5 wherein the display further includes a patterned bottom electrode.

8. A display in accordance with claim 1 wherein the light-emitting devices are arranged on the substrate in repeating groups of light-emitting devices and wherein the light-emitting devices within a repeating group emit directly generated electroluminescent light at two or more different predetermined wavelengths or wavelength bands.

9. A display in accordance with claim 1 wherein the predetermined wavelength or wavelength band is in the near-visible, visible, infra-red, or ultraviolet.

10. A display in accordance with claim 1 wherein the electrode material forms an electrode that is common to the plurality of light-emitting devices.

11. A display comprising: a substrate and a plurality of light-emitting devices disposed on the substrate, wherein the substrate is a semiconductor wafer including an integrated circuit useful for illuminating the light-emitting devices, and wherein a light-emitting device comprises a first charge transport layer disposed over the circuit, an electrode comprising a transparent anode disposed over the first charge transport layer, and a light-emitting material comprising semiconductor nanocrystals selected to emit electroluminescent light at a predetermined wavelength or wavelength band disposed between the substrate and electrode, and wherein electroluminescent light emitted by the plurality of light-emitting devices includes directly generated electroluminescent light at two or more different predetermined wavelengths or wavelength bands for a desired light output, wherein the display does not further include a color converting luminescent material.

12. A display in accordance with claim 11 further comprising a second charge transport layer disposed between the first charge transport layer and the electrode.

13. A display in accordance with claim 12 wherein the semiconductor wafer comprises silicon or polysilicon.

14. A display in accordance with claim 13 wherein the circuit is an active matrix circuit.

15. A display in accordance with claim 14 wherein the semiconductor nanociystals comprise a core/shell structure.

16. A display in accordance with claim 11 wherein the light-emitting devices are arranged on the substrate in repeating groups of light-emitting devices and wherein the light-emitting devices within a repeating group emit directly generated electroluminescent light at two or more different predetermined wavelengths or wavelength bands.

17. A micro-display comprising a substrate and a plurality of light-emitting devices disposed on the substrate, wherein the substrate is a semiconductor wafer including an integrated circuit useful for illuminating the light-emitting devices, and wherein a light-emitting device comprises a light-emitting material comprising semiconductor nanocrystals selected to emit electroluminescent light at a predetermined wavelength or wavelength band and an electrode material in electrical connection with the light-emitting material on a side thereof remote from the substrate, and wherein electroluminescent light emitted by the plurality of light-emitting devices includes directly generated electroluminescent light at two or more different predetermined wavelengths or wavelength bands for a desired light output wherein the display does not further include a color converting luminescent material.

18. A micro-display in accordance with claim 17 wherein the circuit comprises an active matrix for controlling the illumination of the light-emitting devices.

19. A micro-display in accordance with claim 17 wherein the semiconductor wafer comprises silicon or polysilicon.

20. A micro-display in accordance with claim 18 wherein the light-emitting device further comprises a first charge transport layer in electrical connection with the active circuit, a second charge transport layer disposed over the first charge transport layer.

21. A micro-display in accordance with claim 20 wherein the micro-display comprises a plurality of light-emitting devices arranged on the substrate in repeating groups of light-emitting devices and wherein the light-emitting devices within a repeating group emit directly generated electroluminescent light at two or more different predetermined wavelengths or wavelength bands.

22. A micro-display in accordance with claim 21 wherein each of the repeating groups of light-emitting devices has a combined average size in the range of from about 10 to about 30 microns.

23. A micro-display in accordance with claim 17 wherein the electrode material is transparent and is selected to function as an anode.

* * * * *